US009852956B2

(12) United States Patent
Logan et al.

(10) Patent No.: US 9,852,956 B2
(45) Date of Patent: Dec. 26, 2017

(54) EXTRACTION OF RESISTANCE ASSOCIATED WITH LATERALLY DIFFUSED DOPANT PROFILES IN CMOS DEVICES

(71) Applicant: GLOBALFOUNDRIES INC., Grand Cayman (KY)

(72) Inventors: Lyndon Ronald Logan, Poughkeepsie, NY (US); Edward J. Nowak, Essex Junction, VT (US); Robert R. Robison, Colchester, VT (US); Jonathan K. Winslow, Cortlandt Manor, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 527 days.

(21) Appl. No.: 14/613,570

(22) Filed: Feb. 4, 2015

(65) Prior Publication Data

US 2016/0225680 A1   Aug. 4, 2016

(51) Int. Cl.
*H01L 21/66* (2006.01)
*H01L 21/8234* (2006.01)
*H01L 29/45* (2006.01)
*G01R 31/26* (2014.01)

(52) U.S. Cl.
CPC .......... *H01L 22/14* (2013.01); *G01R 31/2621* (2013.01); *H01L 21/823431* (2013.01); *H01L 22/34* (2013.01); *H01L 29/45* (2013.01)

(58) Field of Classification Search
CPC ......... H01L 22/14; H01L 23/58; H01L 27/12; G01R 3/26
USPC .......................... 702/82; 257/48, 350; 438/14
See application file for complete search history.

(56) References Cited

U.S. PATENT DOCUMENTS

| 5,217,907 | A  | 6/1993  | Bulucea et al. |
| 5,710,052 | A  | 1/1998  | Alvis et al.   |
| 6,963,393 | B2 | 11/2005 | Borden         |
| 7,078,919 | B2 | 7/2006  | Prussin        |

(Continued)

FOREIGN PATENT DOCUMENTS

CN     102945841 A    2/2013

OTHER PUBLICATIONS

IPCOM000138854D: "Method for the extraction of effective lateral doping profile and source/drain parasitic resistance components from semiconductor MOSFET devices" IBM Aug. 7, 2006.

(Continued)

*Primary Examiner* — John Breene
*Assistant Examiner* — Kaleria Knox
(74) *Attorney, Agent, or Firm* — Anthony Canale; Hoffman Warnick LLC

(57) ABSTRACT

Various embodiments provide systems, computer program products and computer implemented methods. In some embodiments, a system includes a computer-implemented method of determining a laterally diffuse dopant profile in semiconductor structures by providing first and second semiconductor structures having plurality of gate array structures in a silicided region separated from each other by a first distance and second distance. A potential difference is applied across the plurality of gate array structures and resistances are determined. A linear-regression fit is performed on measured resistance versus the first distance and the second distance with an extrapolated x equals 0 and a y-intercept to determine a laterally diffused dopant-profile under the plurality of gate array structures based on a semiconductor device model.

20 Claims, 7 Drawing Sheets

(56) References Cited

U.S. PATENT DOCUMENTS 7,205,567 B2     4/2007   Felber et al.
8,595,663 B1    11/2013   Lu

OTHER PUBLICATIONS

"A New Method to Determine Effective Lateral Doping Abruptness and Spreading-Resistance Components in Nanoscale MOSFETs" Seong-Dong Kim; Narasimha, S.; Ken Rim Electron Devices, IEEE Transactions onvol. 55, Issue: 4, Publication Year: 2008, pp. 1035-1041 Digital Object Identifier: 10.1109/TED.2008.917548.

EXTRACTION OF RESISTANCE ASSOCIATED WITH LATERALLY DIFFUSED DOPANT PROFILES IN CMOS DEVICES

BACKGROUND

This invention concerns the measurement of lateral diffusion in the manufacture of small semiconductor structures such as those used in the source and drain regions of complimentary-metal-oxide-semiconductor (CMOS) transistors in integrated circuits.

Some of the prior art methods for measuring lateral diffusion (identified by how far the junction moves laterally during anneal) and abruptness (which is defined by the slope of the diffused profile) include electrical probing of transistors, capacitance atomic force microscopy (C-AFM), and inference from vertical secondary ion mass spectroscopy (SIMS) profiles.

Inference of lateral diffusion and abruptness is possible from electrical probing of transistors. This procedure requires contact to a full transistor structure. Consequently, electrical probing is impractical at the point in the process when the doped layers are being formed and the transistor is still incomplete. The time between the source/drain (S/D) process steps and the first opportunity to probe can be days or weeks, greatly reducing the ability to implement real-time process control.

Probe methods such as capacitance atomic force microscopy (C-AFM) require sectioning of the transistor and various intermediate preparation steps. Even when this is complete, probing requires several hours, and the resolution is typically too poor to provide an accurate measure of diffusion for purposes of process control.

A current extraction method of laterally doping profiles requires a large series of process splits (spacer/extension variation) to create the devices. In addition, the method depends on $C_{ov}$ (gate-to-extension overlap capacitance) and $L_{eff}$ (gate-to-extension effective length) measurements which are problematic due to a high variance in these measurements as CMOS devices are made smaller.

It would be desirable to have a method for determining lateral diffusion profiles in CMOS devices without the need for process splits or $C_{ov}$ and $L_{eff}$ measurements.

BRIEF SUMMARY

Various aspects of the invention provide for systems, computer program products and computer implemented methods. In some embodiments, a method, a computer program product and system of determining a laterally diffused dopant profile in a semiconductor device is provided.

A first aspect provides a method of extraction of resistance components in a semiconductor device to determine a laterally diffused dopant profile in a semiconductor structure. The method includes providing a first semiconductor structure with a plurality of gate array structures in a silicided region, wherein the first semiconductor structure includes unsilicided S/D regions extending beyond the silicided region, the unsilicided S/D regions including a plurality of resistors, wherein the plurality of gate array structures are separated by a first distance from each other. The method includes providing a second semiconductor structure with a plurality of gate array structures in a silicided region, wherein the second semiconductor structure includes unsilicided S/D regions extending beyond the silicided region, the unsilicided S/D regions including a plurality of resistors, wherein the plurality of gate array structures are separated by a second distance from each other. A potential difference is applied in the silicided region of the first semiconductor structure and the second semiconductor structure. Associated currents running between the plurality of gate array structures of the first semiconductor structure are measured. Associated currents running between the plurality of gate array structures of the second semiconductor structure are measured. The resistance on the plurality of resistors of the first semiconductor structure is determined. The resistance on the plurality of resistors of the second semiconductor structure is determined. A linear-regression fit of measured resistance on the plurality of resistors in the first semiconductor structure and the plurality of resistors in the second semiconductor structure versus the first distance and the second distance with an extrapolated x equals 0 and a y-intercept is performed to determine a laterally diffused dopant-profile under the plurality of gate array structures in the first semiconductor device and the second semiconductor device based on a semiconductor device model.

A second aspect provides a system including a first semiconductor structure having plurality of gate array structures in a silicided region wherein the plurality of gate array structures are separated by a first distance from each other and unsilicided S/D areas extend beyond the silicided region and include a plurality of resistors. A potential difference is applied in the silicided region of the first semiconductor structure and associated currents running between the plurality of gate array structures of the first semiconductor structure are measured and resistance of the plurality of resistors of the first semiconductor structure is determined. The system includes a second semiconductor structure having plurality of gate array structures in a silicided region wherein the plurality of gate array structures are separated by a second distance from each other and unsilicided S/D areas extend beyond the silicided region and include a plurality of resistors. A potential difference is applied in the silicided region of the second semiconductor structure and associated currents running between the plurality of gate array structures of the second semiconductor structure are measured and resistance on the plurality of resistors of the second semiconductor device is determined. The system includes at least on computer configured to perform a linear-regression fit of measured resistance on the plurality of resistors in the first semiconductor structure and the plurality of resistors in the second semiconductor structure versus the first distance and the second distance with an extrapolated x equals 0 and a y-intercept to determine a laterally diffused dopant-profile under the plurality of gate array structures in the first semiconductor structure and the second semiconductor structure based on a semiconductor device model.

A third aspect provides a product comprising program code stored on a computer-readable storage medium, which when executed by at least one computing device, enables the at least one computing device to implement a method of determining a lateral dopant profile in a semiconductor structures by performing following actions. Currents running between a plurality of gate array structures from a first semiconductor structure with the plurality of gate array structures in a silicided region, wherein the first semiconductor structure includes unsilicided S/D regions extending beyond the silicided region, the unsilicided S/D regions including a plurality of resistors, wherein the plurality of gate array structures are separated from each other by a first distance wherein a potential difference is applied in the silicided region of the first semiconductor structure are received. Resistance on the plurality of resistors of the first semiconductor structure is determined. Currents running between a plurality of gate array structures from a second semiconductor structure with a plurality of gate array structures in a silicided region, wherein the second semiconductor structure includes unsilicided S/D regions extending beyond the silicided region, the unsilicided S/D regions including a plurality of resistors, wherein the plurality of gate array structures are separated from each other by a second distance wherein the potential difference is applied in the silicided region of the second semiconductor structure are received. Resistance on the plurality of resistors of the second semiconductor structure is determined. A linear-regression fit is performed on measured resistance on the plurality of resistors in the first semiconductor structure and the plurality of resistors in the second semiconductor structure versus the first distance and the second distance with an extrapolated x equals 0 and a y-intercept to determine a laterally diffused dopant-profile under the plurality of gate array structures in the first semiconductor structure and the second semiconductor structure based on a semiconductor device model.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements among the drawings.

DETAILED DESCRIPTION

Figure 1:
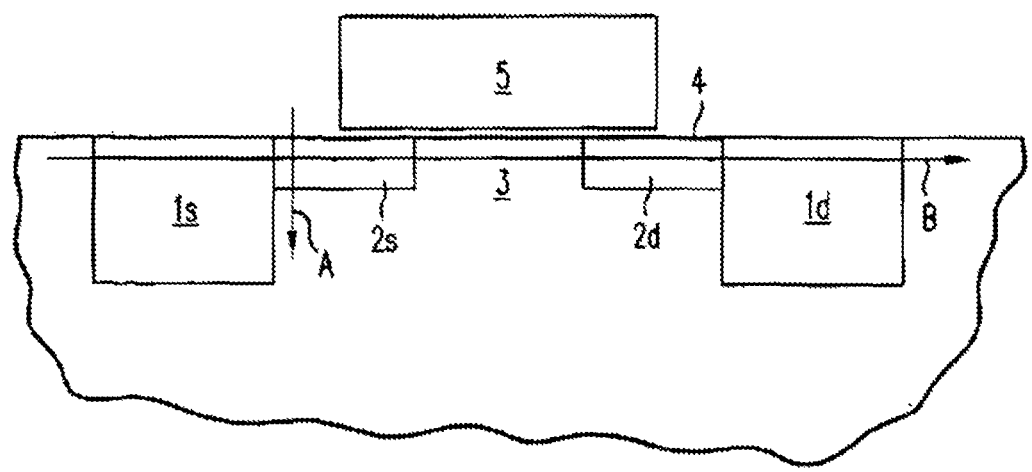
FIG. 1 shows a cross-sectional view of a semiconductor structure of a MOS field effect resistor.

FIG. 1 shows a cross-sectional view of a metal on oxide (MOS) field effect transistor (FET). Such an MOS transistor typically includes source region $1s$ and drain region $1d$, source extension region $2s$ and drain extension region $2d$, channel 3, gate insulator 4 and gate array structure 5. The source and drain regions $1s$ and $1d$ are heavily doped, typically with arsenic for n-type doping or boron for p-type doping. Doping levels are on the order of $10^{20}$ dopant atoms per cubic centimeter. The layers for regions $1s$ and $1d$ are typically 500-700 angstroms deep. The extension regions $2s$ and $2d$ are also heavily doped, with the same type of dopant atoms as the source and drain regions $1s$ and $1d$, but the extension regions are shallower.

Extension regions $2s$ and $2d$ provide contact to the channel region 3. The transistor operates by applying a bias to the gate 5. For example, suppose the regions $1s$, $2s$, $2d$ and $1d$ are n-type, so that the majority carriers are electrons. If a positive voltage is placed on gate 5 with respect to the channel 3, no current will flow between the gate 5 and channel 3 because of the presence of thin gate insulator 4. However, the positive voltage will attract electrons to the gate region 3, creating a thin layer of electrons (called an inversion layer) that connects source extension $2s$ to drain extension $2d$, allowing current to flow between the source and drain. When the voltage on gate 5 is removed, the inversion layer in channel 3 ceases to exist, and the source is disconnected from the drain. In this manner, the transistor can be turned on and off.

In practice, the doping profiles for the various source and drain layers $1s$, $1d$, $2s$ and $2d$ are not perfectly abrupt or box-like. They are usually formed by diffusion processes that may involve several thermal cycles, and other process splits causing the profiles to be somewhat rounded. Variation in individual process steps or the cumulative variation of a series of process steps can cause a loss of abruptness in the profile.

The lateral profile shows a variation in abruptness depending on the tolerance of the individual process steps of semiconductor wafer fabrication. The degradation in lateral abruptness or increase in lateral diffusion has an effect on the performance of the transistor.

Lateral diffusion must be carefully controlled because it directly affects the speed of the transistor and the ability of the transistor to drive the next stage in the circuit. Less lateral abruptness causes the portion of the source and drain extensions $2s$ and $2d$ (FIG. 1) that contact the channel 3 to have lower doping and, hence, higher resistance. The degradation in lateral abruptness creates a series resistance component that leads to a greater voltage drop between the source is and drain $1d$ (FIG. 1). This voltage drop reduces the ability of the transistor to drive the next stage, reducing the speed of the circuit. Additionally, the lateral distance between the source and drain extensions, $2s$ and $2d$, defines the length of the channel region 3. This channel length directly determines certain properties of the transistor, such as cutoff frequency. Lateral diffusion must be carefully controlled because it directly affects the speed of the transistor and the ability of the transistor to drive the next stage in the circuit. Less lateral abruptness, causes the portion of the source and drain extensions which contact the channel to have lower doping and, hence, higher resistance. The degradation in lateral abruptness creates a series resistance component that leads to a greater voltage drop between the source and drain. This voltage drop reduces the ability of the transistor to drive the next stage, reducing the speed of the circuit. Additionally, the lateral distance between the source and drain extensions defines the length of the channel region. This channel length directly determines certain properties of the transistor, such as cutoff frequency. Moreover, the lateral diffusion doping gradient of the source/drain (S/D) gives rise to current crowding at the vicinity of the channel end, leading to spreading resistance components in total S/D external resistance.

One method to determine lateral resistance involves extracting the effective lateral diffused doping profile through a combination of semiconductor device $R_{on}$ (On resistance) characterization and physical modeling. The physical modeling depends on $R_{on}$ versus $C_{ov}$ (capacitance overlap) value ranges. $C_{ov}$ is heavily influenced by overfill, silicide shape, gate height, etc. This situation will only get worse with future generations.

Disclosed herein is a method, system and program product for the extraction of laterally diffused dopant profiles in semiconductor devices. The method and system allows one to determine whether there is a processing problem early in the manufacturing process of a semiconductor device.

The ability to extract a resistance component that depends directly on the dopant-lateral diffusion/gate-overlap is helpful in distinguishing elements of process variation that lead to variation of in-line electrical properties of semiconductor devices or structures. Diagnostic analysis of FET overlap, and junction, capacitance as well as S/D to body diode currents are primary examples of distinguishing process variations in manufacturing. Furthermore, once establishing a correlation between such parametrics and the gate-overlap dopant profile, a process indicator for critical FET properties is available as a test during manufacturing that occurs prior to wiring or other process steps in the manufacture of the FET.

Transistor models are used for almost all modern electronic design work. Analog circuit simulators use models to predict the behavior of a design. Much of the design work is related to integrated circuit designs which have a very large tooling cost, primarily for the photomasks used to create the devices, and there is a large economic incentive to get the design working without numerous iterations. Complete and accurate models allow a large percentage of designs to work the first time. Modern circuits are usually very complex making the performance of such circuits difficult to predict without accurate computer models, including but not limited to models of the devices used. The device models generally include effects of transistor layout: width, length, inter-digitation, proximity to other devices; transient and DC current-voltage characteristics; parasitic device capacitance, resistance, and inductance; time delays; and temperature effects.

Model-extraction methods are generally based on a combination of direct parameter extraction from a multitude of semiconductor structures and mathematical simplification of the model equations and optimization. Because of the complexity of the model and data, these methods allow optimization of only a few parameters at a time. In the disclosure herein a model of semiconductor structures and devices has been developed which correlates lateral diffusion profiles with voltage, current and resistance determination during manufacture of semiconductor devices.

In an embodiment for the semiconductor device model, the parameters are W (the width between the gates, which are determined form the manufacturing layout,) and the measured resistance.

In an embodiment using a TCAD semiconductor device model, the parameters are more numerous. The first step is a process simulation that accurately reflects the structure on the wafer, emulating all of the implanted materials, material deposition and etching, thermal processing and doping. Most of the details would come from the manufacturing process. Destructive techniques are used to measure the actual physical dimensions on the wafer. The techniques include transmission electronic microscopy (TEM), scanning electron microscopy (SEM), and cross sectional profiles of the semiconductor structure.

The next step is to create a device simulation in which output of the process simulation is used to simulate the electrical characteristics of the semiconductor structure. Specifically, a simplified simulation is performed using default parameters which are based on years of literature.

Both the process and device simulators have standard sets of parameters referred to as "default parameters." These are best guess parameters based on literature that are provided by the vendor and are used as a starting point. The process assumes fitting the measured data in TCAD from default parameters.

Process models: In embodiments the rate of dopant capture is adjusted at the silicon/spacer/gate material interface. In practice, lowering this rate lets the junction diffuse more under the gate because less dopant is captured. Raising it reduces diffusion. In embodiments simulated damage from any implants is adjusted. Simulate the implantation in TCAD, and increasing the damage from the implant will increase diffusion, and reducing does the opposite. The combination of these two parameters allows matching of the lateral doping profile.

Device models: The resistance of the metal contacts is assumed based on the metal. In embodiments, the assumed mobility for carriers is adjusted in the simulation.

The parameters for the simulation are determined during a process of looking at many structures across the wafer and over a long period of looking at many lots. In producing the model physical splits are required where the overlap of the junctions is modulated. Once the changes in physical dimension are determined, including material thickness change, the measured resistance is used to fit the dopant overlap in the semiconductor device model for a single spacing of the gate array structures. Changing the rate of dopant capture modulates the slope of the line formed by plotting measured resistance versus material thickness. The results of measured resistance versus spacing (W) is used to fit the carrier mobility and the absolute resistance. When the model matches the split responses the semiconductor device model is complete.

For the disclosure described herein the modeling is initiated by measuring hardware and establishing results for the macro which correlate with a baseline value. For that baseline, the disclosed macro provides a slope and an intercept value. The specific value of the slope and intercept is not directly meaningful, but the variation in these values as the manufacturing process drifts, or changes occur provide indications that the manufacturing devices are not within the desired specification. The macro designed is sensitive to changes in diffusion length under the gate, whereas the prior art ($C_{ov}$ and $R_{on}$), is sensitive to other physical changes. The method disclosed herein combines the results from the semiconductor device model or macro, with existing measured information, to establish whether the semiconductor device is acceptable without having to remove the device and perform destructive testing.

A semiconductor device model that defines a set a parameters associated with a set of semiconductor devices or structures provides a laterally diffused dopant-profile under the plurality of gate array structures. The semiconductor device model models semiconductor fabrication and semiconductor device operation. Included are the modelling of process steps (such as diffusion and ion implantation), and modelling of the behavior of the electrical devices based on fundamental physics, such as the doping profiles of the devices.

Figure 2:
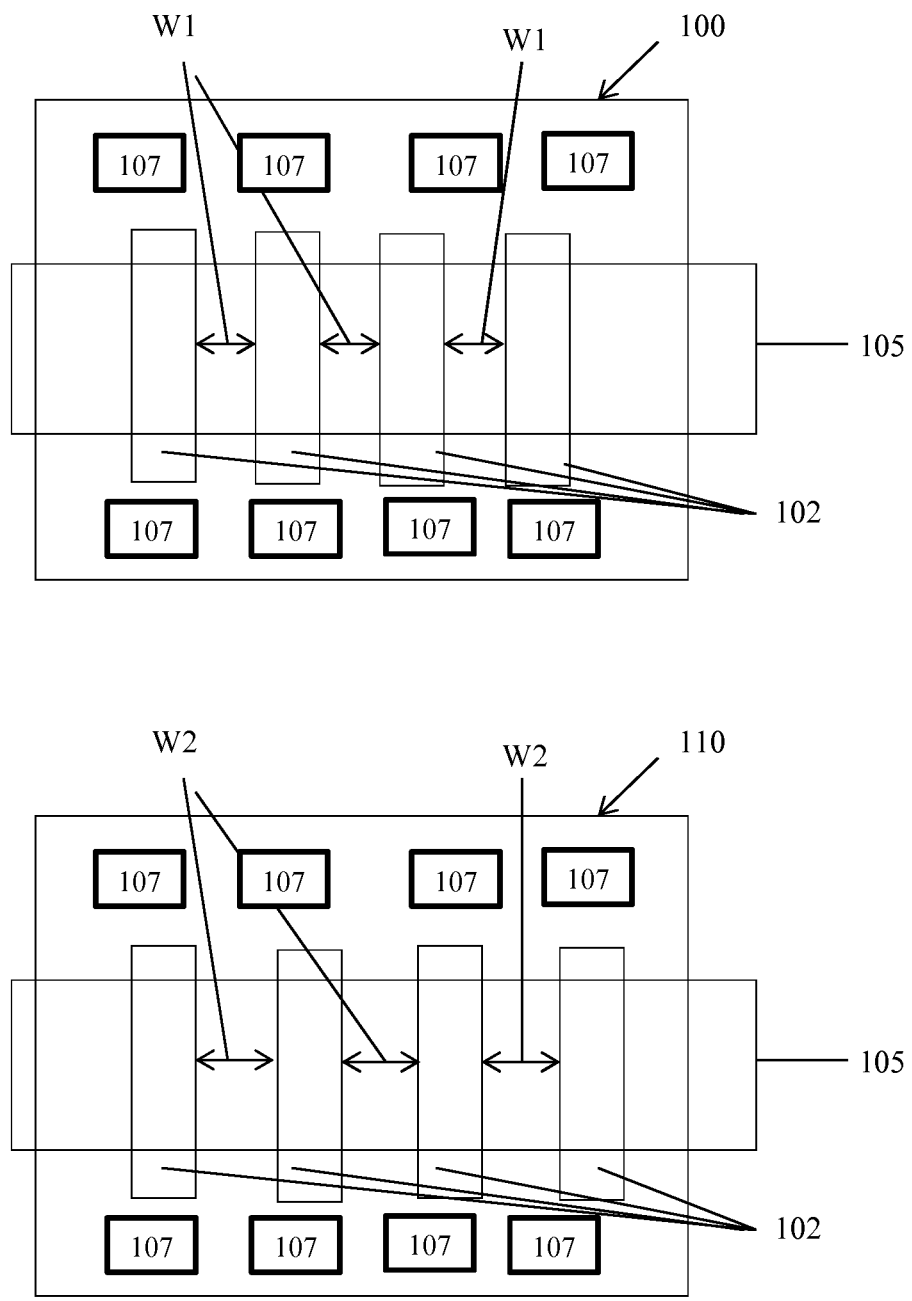
FIG. 2 shows a top view of a test device including first semiconductor structure and second semiconductor structure according to an embodiment of the present invention.

Referring to the drawings FIG. 2 a top view of semiconductor structures 100 and 110 after a process stage in semiconductor device manufacturing where the semiconductor structures 100 and 110 are not completed. The semiconductor structures 100 and 110 each include two or more gate array structures 102 having a spacing or distance W1 (FIG. 1) and W2 (FIG. 2) between the other gate array structures 102. W2 is different than the W1. The spacing or distance is referred to as pitch. A silicided area is shown by box 105. FIG. 2 includes a series of resistors 107 positioned along an unsilicided extension of the semiconductor structures 100 and 110. Structures 100, 110 may be fabricated using any now known or later developed semiconductor processing.

After semiconductor device manufacturing process stage, a voltage is applied across the gate array structures in semiconductor structures 100 and 110 in FIG. 2. The current between the gate array structures and the plurality of resistors are measured on each semiconductor structure 100 and 110 at a voltage. From the currents, the resistances under the gate array structures from the two semiconductors structures 100 and 110 can be determined. Current in the semiconductor structure 100 and 110 (FIG. 2) flows from left to right in the silicided region 105. In the unsilicided region current flow is to the nearest resistor.

After the resistances are determined from the applied voltage and the measured current from the two semiconductors structures 100 and 110, a linear-regression fit of resistance on the plurality of resistors in the first semiconductor device and the plurality of resistors in the second semiconductor device versus the first distance W1 and the second distance W2 with an extrapolated x equals 0 and a y-intercept is performed to determine a laterally diffused dopant-profile under the plurality of gate array structures in the first semiconductor device and the second semiconductor device based on a transistor model. This is shown in FIG. 3 using simulated results.

Figure 3:
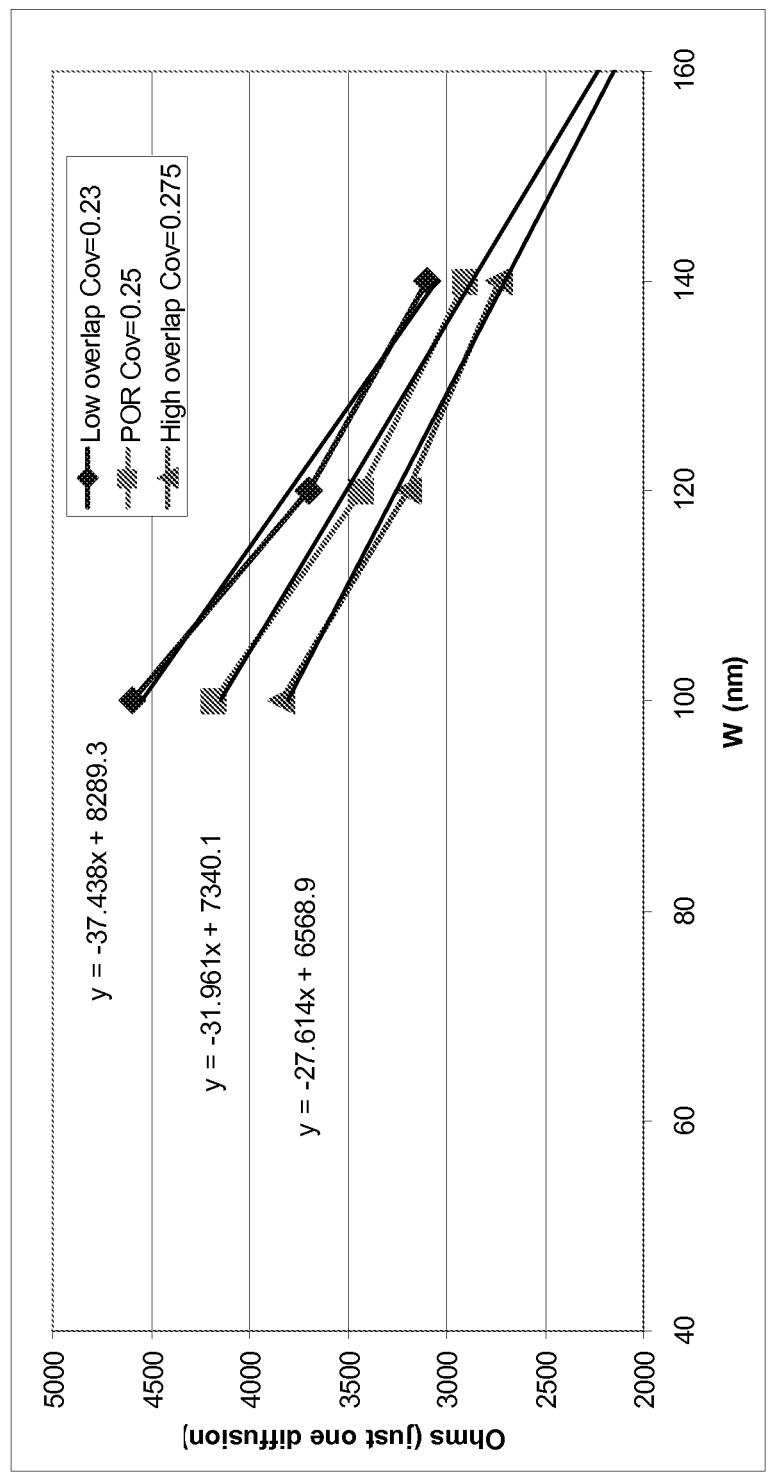
FIG. 3 shows simulated results using resistance profiles extracted from an embodiment described herein.

FIG. 3 is a demonstration of the method in action created by TCAD simulation. Technology CAD (or Technology Computer Aided Design, or TCAD) models semiconductor fabrication and semiconductor device operation. Included are the modelling of process steps (such as diffusion and ion implantation), and modelling of the behavior of the electrical devices based on fundamental physics, such as the doping profiles of the devices.

FIG. 3 shows simulated results that demonstrate that the determination of resistances in semiconductor structures having a varied pitch provides meaningful output that correlates with manufacturing process variations. The disclosure described herein is sensitive to realistic process variations. The slope becomes steeper with less lateral diffusion, and less steep as lateral diffusion increases. The lateral diffusion allows one to monitor and determine changes in the manufacturing process and almost instantaneously reject the semiconductor structure and stop the process to determine why the semiconductor structures are failing.

The method uses measured information from the macro, combined with other information and physical simulation to specifically match the lateral diffusion and thus determine the lateral diffused dopant profile and thereby detect changes in the manufacturing process.

The results of the linear-regression fit of resistance on the plurality of resistors in the first semiconductor device and the plurality of resistors in the second semiconductor device versus the first distance W1 and the second distance W2 based on the semiconductor device model in FIG. 3 correlate with the laterally diffused dopant profile which is then used to accept or reject the first and second semiconductor devices for further processing.

Figure 4:
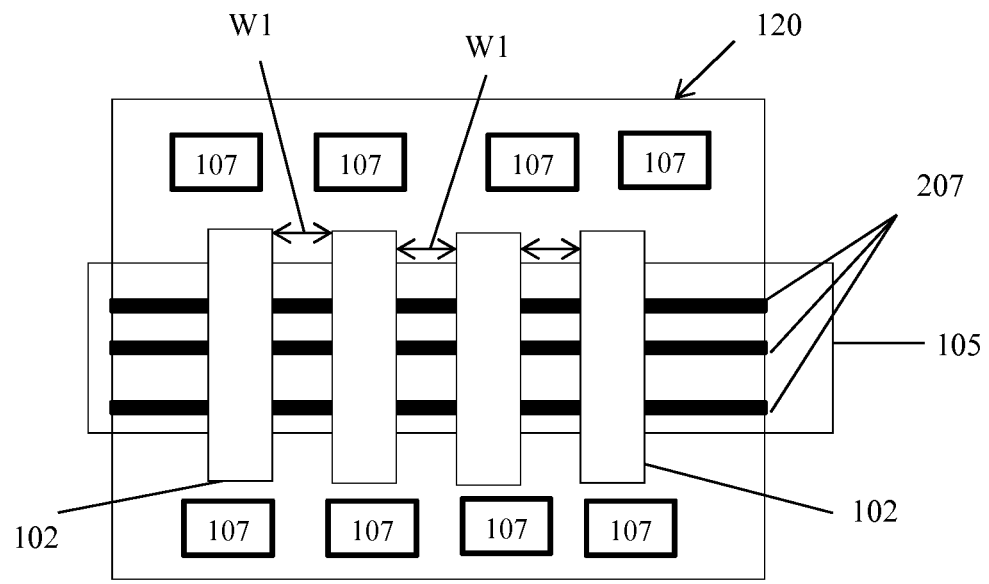
FIG. 4 shows a top view of a test device including a first semiconductor device and second semiconductor device according to an embodiment of the present invention in an alternate embodiment.
Figure 4:
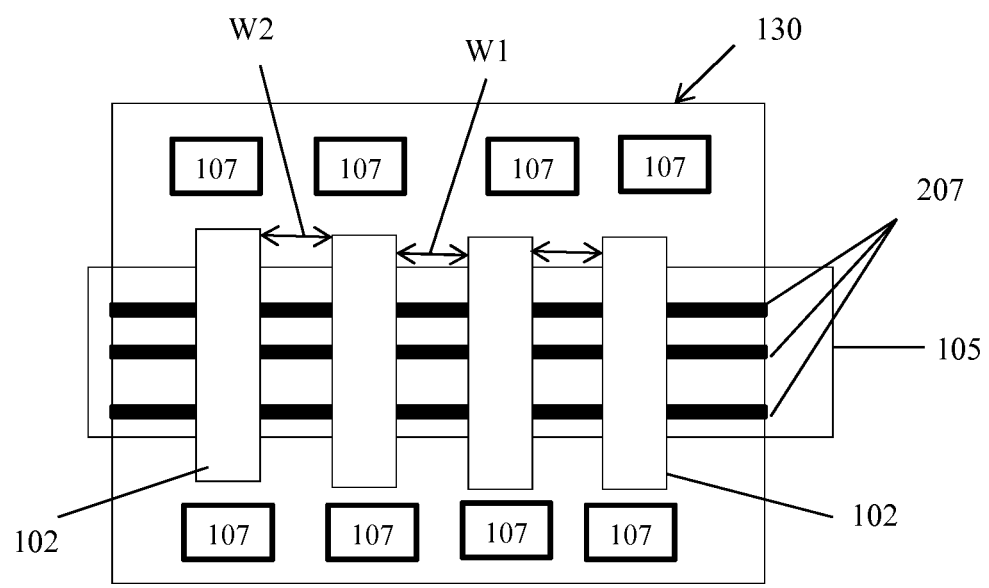

Referring to FIG. 4, an alternate embodiment is shown. A top view of semiconductor structures 120 and 130 are shown in FIG. 4. The semiconductor structures 120 and 130 include a plurality of gate array structures 102 having a spacing W1 between gate array structures 102 for structure 120 and W2 for structure 130. W1 does not equal W2. The pitch is the distance between the gate array structures. The area enclosed by 105 has been silicided for semiconductor structures 120 and 130. Semiconductor structures 120 and 130 include a series of resistors 107 positioned along an unsilicided extension. In addition, fins of silicon have been positioned under each gate array structure 102 of semiconductor structures 120 and 130. FIG. 4 includes a series of resistors 107 positioned along an unsilicided extension of semiconductor structures 120 and 130. In addition fins 207 or channels of silicon have been positioned under each gate array structure.

The semiconductors in FIG. 4 have voltage applied across the gate array structures and the currents are measured. From the currents, the resistances from the two semiconductors can be determined. This can be done any time during the processing. Current in the semiconductor structures 120 and 130 flows from left to right in the silicided region 105. In the unsilicided region current flow is to the nearest resistor.

After the resistances are determined from the applied voltage and the measured current from the two semiconductors in FIG. 4, a linear-regression fit of resistance on the plurality of resistors in the first semiconductor device and the plurality of resistors in the second semiconductor device versus the first distance W1 and the second distance W2 with an extrapolated x equals 0 and a y-intercept is performed to determine a laterally diffused dopant-profile under the plurality of gate array structures in the first semiconductor device and the second semiconductor device based on a semiconductor device model.

FIG. 4 embodies FinFET transistors wherein the channels or fins 207 are positioned under the gate array structures 102. This allows the use of lower threshold voltages, which results in improved switching speeds and power In the embodiments shown in FIGS. 2 and 4, a third semiconductor device can be included with a spacing between the gate array structures 102 that is W3 wherein W3 does not equal W2 or W1. In this embodiment, a linear regression fit of measured resistance on the plurality of resistors in the first semiconductor device and the plurality of resistors in the second semiconductor device and the plurality of resistors in the third semiconductor device versus the first distance, the second distance and the third distance with an extrapolated x equals 0 and a y-intercept to determine a laterally diffused dopant-profile under the plurality of gate array structures in the first semiconductor device and the second semiconductor device based on the semiconductor device model. Parameters are extracted from the measured data in S2. The parameter extraction correlates resistance profiles in a semiconductor structure with a lateral diffusion profile in the structure.

Figure 5:
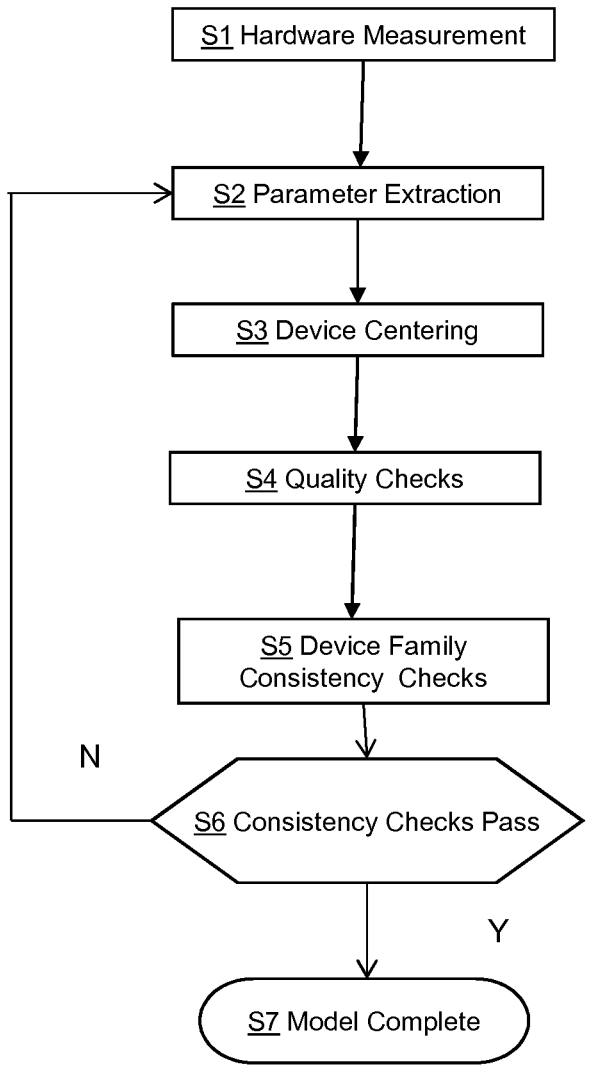
FIG. 5 is a flow chart illustrating the methodology for a semiconductor device model.

FIG. 5 is a flow chart illustrating the methodology for providing a semiconductor device model of lateral diffusion profile versus current and resistance determinations on the semiconductor structures described in FIGS. 2 and 4. Hardware measurements are performed on multiple devices in S1. Each of the parameters for each of the devices is extracted from the hardware measurements (block S2) and the model parameters then go through a device centering step (block S3). Generally during the device centering steps (S3), a limited set of model parameters is adjusted to make key model characteristics match set technology targets. After the centering steps, quality checks are performed on the extracted device model (block S4) for each of the devices. Once the set of devices have passed the quality check, a family consistency check is performed (block S5). At this stage the model is used for simulations of key device characteristics across the entire allowable range of device size, temperature, and bias conditions and checked for consistency between all devices in a family of devices. If the consistency checks fail, ("No" branch of decision block S6), then the portions of the models that are failing need to be modified and re-extracted (block S2) from the measured data which may need to be adjusted, or further manipulated or optimized prior to extraction. Then the device centering (block S3) and quality checks (block S4) are repeated. This continues until the family consistency checks pass ("Yes" branch of decision block S6) the semiconductor device model is completed (Block S7).

Figure 6:
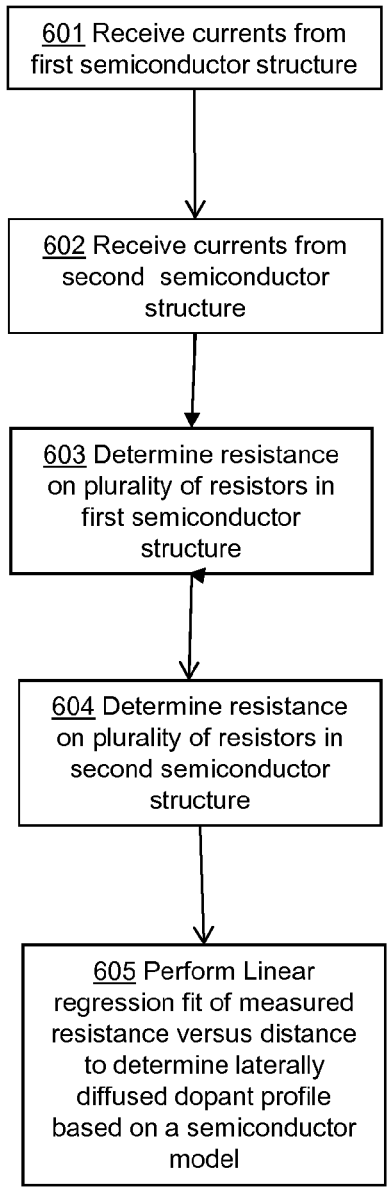
FIG. 6 is a flow chart illustrating the methodology for an embodiment of the invention.

FIG. 6 is a flow chart illustrating the methodology for determining the lateral diffusion profile of semiconductor structures during manufacturing. Currents running between a plurality of gate array structures in a silicided region from a first semiconductor structure are received in Block 601. The first semiconductor structure includes unsilicided S/D regions extending beyond the silicided region. The unsilicided S/D regions include a plurality of resistors. The plurality of gate array structures are separated from each other by a first distance. A potential difference is applied in the silicided region of the first semiconductor structure. Currents running between a plurality of gate array structures in a silicided region from a second semiconductor structure are received in Block 602. The second semiconductor structure includes unsilicided S/D regions extending beyond the silicided region. The unsilicided S/D regions include a plurality of resistors. The plurality of gate array structures are separated from each other by a second distance different from the first distance. A potential difference is applied in the silicided region of the second semiconductor structure. In Block 603, the resistance on the plurality of resistors of the first semiconductor structure is determined. In Block 604, the resistance on the plurality of resistors of the second semiconductor structure is determined. A linear-regression fit of measured resistance on the plurality of resistors in the first semiconductor structure and the plurality of resistors in the second semiconductor structure versus the first distance and the second distance with an extrapolated x equals 0 and a y-intercept to determine a laterally diffused dopant-profile under the plurality of gate array structures in the first semiconductor structure and the second semiconductor structure based on a semiconductor device model is performed in Block 605.

Figure 7:
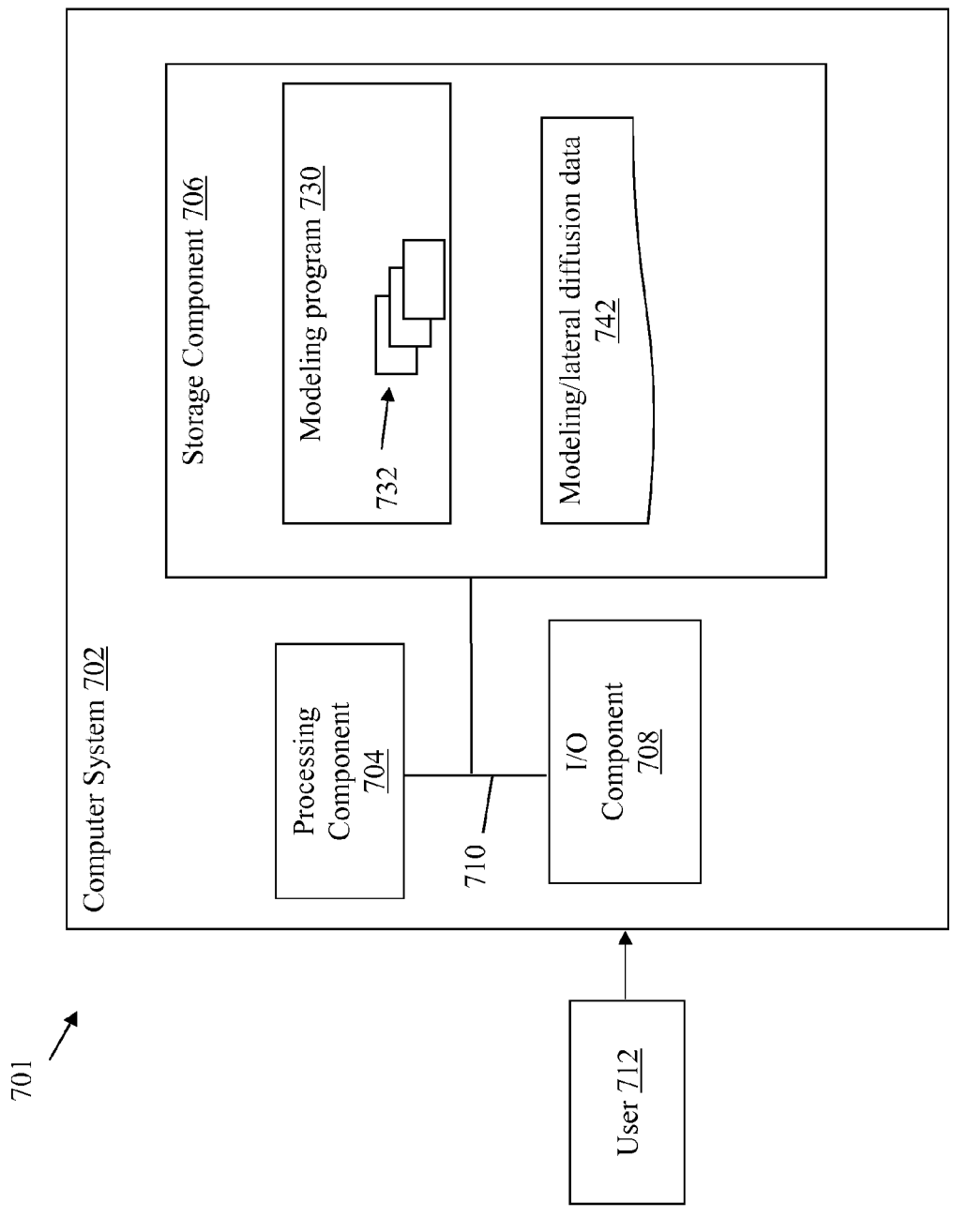
FIG. 7 shows an illustrative environment according to various embodiments.

FIG. 7 depicts an illustrative environment 701 for the determination of the lateral diffused profile. To this extent, the environment 701 includes a computer system 702 that can perform a process described herein in order to determine and lateral dopant profiles. In particular, the computer system 602 is shown as including a TCAD modeling program 730, which makes computer system 702 operable to handle modeling of semiconductor process by performing any/all of the processes described herein and implementing any/all of the embodiments described herein.

The computer system 702 is shown including a processing component 704 (e.g., one or more processors), a storage component 706 (e.g., a storage hierarchy), an input/output (I/O) component 708 (e.g., one or more I/O interfaces and/or devices), and a communications pathway 710. In general, the processing component 704 executes program code, such as the modeling program 730, which is at least partially fixed in the storage component 706. While executing program code, the processing component 704 can process data, which can result in reading and/or writing transformed data from/to the storage component 706 and/or the I/O component 708 for further processing. The pathway 710 provides a communications link between each of the components in the computer system 702. The I/O component 708 can comprise one or more human I/O devices, which enable a human user 712 to interact with the computer system 702 and/or one or more communications devices to enable a system user 712 to communicate with the computer system 702 using any type of communications link. To this extent, modeling program 730 can manage a set of interfaces (e.g., graphical user interface(s), application program interface, etc.) that enable human and/or system users 712 to interact with modeling program 730. Further, the modeling program 730 can manage (e.g., store, retrieve, create, manipulate, organize, present, etc.) data, such as modeling/concentration data 742, etc., using any solution.

In any event, the computer system 702 can comprise one or more general purpose computing articles of manufacture (e.g., computing devices) capable of executing program code, such as the modeling program 730, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the modeling program 630 can be embodied as any combination of system software and/or application software.

Further, the modeling program 730 can be implemented using a set of modules 732. In this case, a module 732 can enable the computer system 702 to perform a set of tasks used by the modeling program 730, and can be separately developed and/or implemented apart from other portions of the modeling program 730. As used herein, the term "component" means any configuration of hardware, with or without software, which implements the functionality described in conjunction therewith using any solution, while the term "module" means program code that enables the computer system 702 to implement the functionality described in conjunction therewith using any solution. When fixed in a storage component 706 of a computer system 702 that includes a processing component 704, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 702.

When the computer system 702 comprises multiple computing devices, each computing device may have only a portion of modeling program 730 fixed thereon (e.g., one or more modules 732). However, it is understood that the computer system 702 and modeling program 730 are only representative of various possible equivalent computer systems that may perform a process described herein. To this extent, in other embodiments, the functionality provided by the computer system 702 and modeling program 730 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 702 includes multiple computing devices, the computing devices can communicate over any type of communications link. Further, while performing a process described herein, the computer system 702 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 702 can obtain or provide data, such data 742 as the semiconductor model. For example, the computer system 702 can generate and/or be used to generate data 742, retrieve data 742, from one or more data stores, receive data 742 a, from another system, send data 742 to another system, etc.

While shown and described herein as a method and system for modeling semiconductor material, it is understood that aspects of the invention further provide various alternative embodiments. For example, in one embodiment, the invention provides a computer program fixed in at least one computer-readable medium, which when executed, enables a computer system to perform a methods of modeling semiconductor material. To this extent, the computer-readable medium includes program code, such as computer system 702 (FIG. 7), which implements some or all of a process described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of process control in semiconductor device manufacturing, the method comprising:
    providing a first semiconductor structure with a plurality of gate array structures in a silicided region, wherein the first semiconductor structure includes unsilicided source/drain (S/D) regions extending beyond the silicided region, the unsilicided S/D regions including a plurality of resistors, wherein the plurality of gate array structures are separated from each other by a first distance;
    providing a second semiconductor structure with a plurality of gate array structures in a silicided region, wherein the second semiconductor structure includes unsilicided S/D regions extending beyond the silicided region, the unsilicided S/D regions including a plurality of resistors, wherein the plurality of gate array structures are separated from each other by a second distance;
    applying a potential difference in the silicided region of the first semiconductor structure and the second semiconductor structure;
    measuring associated currents running between the plurality of gate array structures of the first semiconductor structure;
    measuring associated currents running between the plurality of gate array structures of the second semiconductor structure;
    determining resistance on the plurality of resistors of the first semiconductor structure;
    determining resistance on the plurality of resistors of the second semiconductor structure; and
    performing a linear-regression fit of measured resistance on the plurality of resistors in the first semiconductor structure and the plurality of resistors in the second semiconductor structure versus the first distance and the second distance with an extrapolated x equals 0 and a y-intercept to determine a laterally diffused dopant-profile under the plurality of gate array structures in the first semiconductor structure and the second semiconductor structure based on a semiconductor device model.

2. The method of claim 1, further comprising:
    using the laterally diffused dopant profile to accept or reject the first and second semiconductor structures for further processing.

3. The method of claim 1, wherein the first semiconductor structure and the second semiconductor structure each include a set of fins, a first portion of the set of fins covered by the plurality of gate array structures and a second portion of the set of fins not covered by the plurality of gate array structures.

4. The method of claim 3, wherein the first portion of the set of fins is a different height than the second portion of the set of fins.

5. The method of claim 1, further comprising:
providing a third semiconductor structure with a plurality of gate array structures in a silicided region, wherein the second semiconductor structure includes unsilicided S/D regions extending beyond the silicided region, the unsilicided S/D regions including a plurality of resistors, wherein the plurality of gate array structures are separated from each other by a third distance;
applying a potential difference in the silicided region of the third semiconductor structure;
measuring associated currents running between the plurality of gate array structures in the third semiconductor structure;
determining resistance on the plurality of resistors in the third semiconductor structure; and
performing a linear-regression fit of measured resistance on the plurality of resistors in the first semiconductor structure and the plurality of resistors in the second semiconductor structure and the plurality of resistors in the third semiconductor structure versus the first distance, the second distance and the third distance with an extrapolated x equals 0 and a y-intercept to determine a laterally diffused dopant-profile under the plurality of gate array structures in the first semiconductor structure and the second semiconductor structure based on a semiconductor device model.

6. The method of claim 5, wherein the first semiconductor structure, the second semiconductor structure and the third semiconductor structure each include a set of fins, a first portion of the set of fins covered by the plurality of gate array structures and a second portion of the set of fins not covered by the plurality of gate array structures.

7. The method of claim 6, wherein the first portion of the set of fins is a different height than the second portion of the set of fins.

8. A system comprising:
a first semiconductor structure having plurality of gate array structures in a silicided region wherein the plurality of gate array structures are separated from each other by a first distance from each other;
unsilicided S/D areas extending beyond the silicided region, and contacted along a periphery of the first semiconductor structure, the unsilicided S/D region including a plurality of resistors wherein a potential difference is applied in the silicided region of the first semiconductor structure and currents running between the plurality of gate array structures of the first semiconductor structure are measured and resistance on the plurality of resistors of the first semiconductor structure is determined;
a second semiconductor structure having plurality of gate array structures in a silicided region wherein the plurality of gate array structures are separated from each other by a second distance;
unsilicided S/D areas extending beyond the silicided region, and contacted along a periphery of the second semiconductor structure, the unsilicided S/D region including a plurality of resistors wherein the potential difference is applied in the silicided region of the second semiconductor structure and currents running between the plurality of gate array structures of the second semiconductor structure are measured and resistance on the plurality of resistors of the second semiconductor structure is determined; and
at least one computer configured: to perform a linear-regression fit of measured resistance on the plurality of resistors in the first semiconductor structure and the plurality of resistors in the second semiconductor structure versus the first distance and the second distance with an extrapolated x equals 0 and a y-intercept to determine a laterally diffused dopant-profile under the plurality of gate array structures in the first semiconductor structure and the second semiconductor structure based on a semiconductor device model.

9. The system of claim 8, wherein the first semiconductor structure and the second semiconductor structure each include a set of fins, a first portion of the set of fins covered by the plurality of gate array structures and a second portion of the set of fins not covered by the plurality of gate array structures.

10. The system of claim 9, wherein the first portion of the set of fins is a different height than the second portion of the set of fins.

11. The system of claim 8, further comprising:
a third semiconductor structure having plurality of gate array structures in a silicided region wherein the plurality of gate array structures are separated from each other by a third distance;
unsilicided S/D areas extending beyond the silicided region, and contacted along a periphery of the semiconductor, the unsilicided S/D region including a plurality of resistors, wherein the potential difference is applied in the silicided region of the third semiconductor device and associated currents running between the plurality of gate array structures of the third semiconductor device are measured and resistance on the plurality of resistors of the third semiconductor device are determined, wherein the at least one computer is configured to perform a linear-regression fit of measured resistance on the plurality of resistors in the first semiconductor device, the plurality of resistors in the second semiconductor device and the plurality of resistors in the third semiconductor device versus the first distance, the second distance and third distance with an extrapolated x equals 0 and a y-intercept to determine a laterally diffused dopant-profile under the plurality of gate array structures in the first semiconductor device, the second semiconductor device and the third semiconductor device based on the semiconductor device model.

12. The system of claim 11, wherein the first semiconductor device, the second semiconductor device and the third semiconductor device each include a set of fins, a first portion of the set of fins covered by the plurality of gate array structures and a second portion of the set of fins not covered by the plurality of gate array structures.

13. The system of claim 12, wherein the first portion of the set of fins is a different height than the second portion of the set of fins.

14. A computer program product comprising program code stored on a computer-readable storage medium, which when executed by at least one computing structure, enables the at least one computing device to implement a method of determining a lateral dopant profile in a semiconductor structure by performing actions including:
receiving currents running between a plurality of gate array structures from a first semiconductor structure with the plurality of gate array structures in a silicided region, wherein the first semiconductor structure includes unsilicided S/D regions extending beyond the silicided region, the unsilicided S/D regions including a plurality of resistors, wherein the plurality of gate array structures are separated from each other by a first distance wherein a potential difference is applied in the silicided region of the first semiconductor structure;

determining resistance on the plurality of resistors of the first semiconductor structure;

receiving currents running between a plurality of gate array structures from a second semiconductor structure with a plurality of gate array structures in a silicided region, wherein the second semiconductor structure includes unsilicided S/D regions extending beyond the silicided region, the unsilicided S/D regions including a plurality of resistors, wherein the plurality of gate array structures are separated from each other by a second distance wherein the potential difference is applied in the silicided region of the second semiconductor structure;

determining resistance on the plurality of resistors of the second semiconductor structure; and performing a linear-regression fit of measured resistance on the plurality of resistors in the first semiconductor structure and the plurality of resistors in the second semiconductor structure versus the first distance and the second distance with an extrapolated x equals 0 and a y-intercept to determine a laterally diffused dopant-profile under the plurality of gate array structures in the first semiconductor structure and the second semiconductor structure based on a semiconductor device model.

15. The computer program product of claim 14, wherein the first semiconductor structure and the second semiconductor structure each include a set of fins, a first portion of the set of fins covered by the plurality of gate array structures and a second portion of the set of fins not covered by the plurality of gate array structures.

16. The computer program product of claim 15, wherein the first portion of the set of fins is a different height than the second portion of the set of fins.

17. The computer program product of claim 14, further comprising:

receiving currents running between a plurality of gate array structures from a third semiconductor structure with a plurality of gate array structures in a silicided region, wherein the third semiconductor structure includes unsilicided S/D regions extending beyond the silicided region, the unsilicided S/D regions including a plurality of resistors, wherein the plurality of gate array structures are separated from each other by a third distance wherein the potential difference is applied in the silicided region of the third semiconductor structure;

determining resistance on the plurality of resistors of the third semiconductor structure; and performing a linear-regression fit of measured resistance on the plurality of resistors in the first semiconductor structure, the plurality of resistors in the second semiconductor structure and the plurality of resistors in the third semiconductor structure versus the first distance, the second distance and third distance with an extrapolated x equals 0 and a y-intercept to determine a laterally diffused dopant-profile under the plurality of gate array structures in the first semiconductor structure, the second semiconductor structure and the third semiconductor structure based on the semiconductor device model.

18. The computer program product of claim 17, wherein the first semiconductor structure, the second semiconductor structure and the third semiconductor structure each include a set of fins, a first portion of the set of fins covered by the plurality of gate array structures and a second portion of the set of fins not covered by the plurality of gate array structures.

19. The computer program product of claim 17, wherein the first semiconductor structure, the second semiconductor structure and the third semiconductor structure each include a set of fins, a first portion of the set of fins covered by the plurality of gate array structures and a second portion of the set of fins not covered by the plurality of gate array structures.

20. The computer program product of claim 17, wherein the first portion of the set of fins is a different height than the second portion of the set of fins.

* * * * *